US011224130B2

(12) United States Patent
Jones et al.

(10) Patent No.: US 11,224,130 B2
(45) Date of Patent: *Jan. 11, 2022

(54) COMPOSITE TRANSPARENT CONDUCTORS AND METHODS OF FORMING THE SAME

(71) Applicant: Cambrios Film Solutions Corporation, Tortola (VG)

(72) Inventors: David Jones, Mountain View, CA (US); Florian Pschenitzka, San Francisco, CA (US); Xina Quan, Saratoga, CA (US); Michael A. Spaid, Mountain View, CA (US); Jeffrey Wolk, Half Moon Bay, CA (US)

(73) Assignee: Cambrios Film Solutions Corporation, Tortola (VG)

( * ) Notice: Subject to any disclaimer, the term of this patent is extended or adjusted under 35 U.S.C. 154(b) by 0 days.

This patent is subject to a terminal disclaimer.

(21) Appl. No.: 16/283,808

(22) Filed: Feb. 24, 2019

(65) Prior Publication Data

US 2019/0191569 A1 Jun. 20, 2019

Related U.S. Application Data

(60) Division of application No. 13/206,279, filed on Aug. 9, 2011, now Pat. No. 10,244,637, which is a
(Continued)

(51) Int. Cl.
*H05K 3/24* (2006.01)
*H01L 31/18* (2006.01)
(Continued)

(52) U.S. Cl.
CPC .............. *H05K 3/245* (2013.01); *B82Y 10/00* (2013.01); *B82Y 30/00* (2013.01); *H01L 29/413* (2013.01); *H01L 31/1884* (2013.01); *H05K 3/249* (2013.01); *G02F 1/13439* (2013.01); *H01L 29/0669* (2013.01); *H01L 51/0048* (2013.01); *H01L 51/5206* (2013.01);
(Continued)

(58) Field of Classification Search
CPC ..... H05K 2201/0257; H05K 2201/026; H05K 2201/0272; H05K 3/24
See application file for complete search history.

(56) References Cited

U.S. PATENT DOCUMENTS 6,686,249 B1 * 2/2004 Yukinobu ............ C03C 17/3411
252/514
6,936,761 B2 * 8/2005 Pichler .................... G02F 1/155
136/252
(Continued)

OTHER PUBLICATIONS

Su et al., Theory of thermal conductivity of graphene-polymer nanocomposites with interfacial Kapitza resistance and graphene-graphene contact resistance, Carbon 137 (Year: 2018).*
(Continued)

*Primary Examiner* — Chris H Chu
(74) *Attorney, Agent, or Firm* — Cooper Legal Group, LLC

(57) ABSTRACT

Composite transparent conductors are described, which comprise a primary conductive medium based on metal nanowires and a secondary conductive medium based on a continuous conductive film.

16 Claims, 4 Drawing Sheets

Related U.S. Application Data continuation of application No. 12/106,193, filed on Apr. 18, 2008, now Pat. No. 8,018,563.

(60) Provisional application No. 60/913,231, filed on Apr. 20, 2007.

(51) Int. Cl.

| | |
|---|---|
| *H01L 29/41* | (2006.01) |
| *B82Y 10/00* | (2011.01) |
| *B82Y 30/00* | (2011.01) |
| *G02F 1/1343* | (2006.01) |
| *H01L 51/00* | (2006.01) |
| *H01L 51/52* | (2006.01) |
| *H05K 1/09* | (2006.01) |
| *H01L 29/06* | (2006.01) |

(52) U.S. Cl.
CPC ..... *H05K 1/097* (2013.01); *H05K 2201/0108* (2013.01); *H05K 2201/026* (2013.01); *Y02E 10/50* (2013.01)

(56) References Cited

U.S. PATENT DOCUMENTS

| | | | | |
|---|---|---|---|---|
| 7,569,765 | B2* | 8/2009 | Matsui | B82Y 10/00 136/263 |
| 2004/0041752 | A1* | 3/2004 | Kimura | G09G 3/2074 345/76 |
| 2004/0265550 | A1* | 12/2004 | Glatkowski | B82Y 10/00 428/209 |
| 2005/0214967 | A1* | 9/2005 | Scher | B82Y 10/00 438/63 |
| 2006/0088960 | A1* | 4/2006 | Saito | B82Y 10/00 438/149 |
| 2006/0111008 | A1* | 5/2006 | Arthur | B82Y 10/00 445/46 |
| 2006/0172282 | A1* | 8/2006 | Naik | B82Y 30/00 435/5 |
| 2007/0003472 | A1* | 1/2007 | Tolt | H01J 1/304 423/447.3 |
| 2007/0128905 | A1* | 6/2007 | Speakman | H05K 1/0265 439/161 |
| 2007/0274895 | A1* | 11/2007 | Jesih | B82Y 30/00 423/462 |
| 2007/0278448 | A1* | 12/2007 | Chari | B82Y 20/00 252/299.01 |
| 2007/0296897 | A1* | 12/2007 | Liu | B82Y 20/00 349/123 |
| 2008/0128688 | A1* | 6/2008 | Pan | B82Y 10/00 257/40 |
| 2009/0061170 | A1* | 3/2009 | Fujikawa | H05K 3/4038 428/195.1 |
| 2009/0129004 | A1* | 5/2009 | Gruner | H01L 31/022466 361/679.21 |
| 2010/0006152 | A1* | 1/2010 | Hatton | B82Y 10/00 136/261 |
| 2010/0065783 | A1* | 3/2010 | Whiteford | B82Y 10/00 252/500 |
| 2010/0197068 | A1* | 8/2010 | Poon | H01L 31/022466 438/63 |
| 2011/0139251 | A1* | 6/2011 | Robinson | H01L 31/0322 136/262 |

OTHER PUBLICATIONS

Rew et al., Electrical and mechanical properties of asphaltic composites containing carbon based fillers, Construction and Building Materials (Year: 2017).*

* cited by examiner

COMPOSITE TRANSPARENT CONDUCTORS AND METHODS OF FORMING THE SAME

CROSS-REFERENCE TO RELATED APPLICATIONS

This application is a division of U.S. application Ser. No. 13/206,279 filed Aug. 9, 2011 (allowed), which is a continuation of U.S. application Ser. No. 12/106,193 filed Apr. 18, 2008 (issued); which claims benefit under 35 U.S.C. 119(e) of U.S. Provisional Patent Application No. 60/913,231, filed Apr. 20, 2007, which is incorporated herein by reference in its entirety.

BACKGROUND

Technical Field

This disclosure is related to composite transparent conductors based on conductive nanostructures, and methods of forming the same.

Description of the Related Art

Transparent conductors refer to optically transparent, thin conductive films. They are widely used as transparent electrodes in flat panel electrochromic displays such as liquid crystal displays, plasma displays, touch panels, electroluminescent devices and thin film photovoltaic cells, as anti-static layers and as electromagnetic wave shielding layers.

Conventional transparent conductors include vacuum deposited metal oxides, such as indium tin oxide (ITO). However, metal oxide films are costly to fabricate because they require vacuum chambers, elevated deposition temperatures and/or high annealing temperatures to achieve high conductivity. Metal oxide films are also fragile and prone to damage even when subjected to minor physical stresses such as bending.

Conductive polymers have also been used as optically transparent electrical conductors. However, they generally have lower conductivity values and higher optical absorption (particularly at visible wavelengths) compared to the metal oxide films, and suffer from lack of chemical and long-term stability.

Conductive nanostructures can form optically transparent conductive films due to their submicron dimensions. Copending and co-owned U.S. patent application Ser. Nos. 11/504,822, 11/871,767, and 11/871,721 describe transparent conductors formed by networking anisotropic conductive nanostructures such as metal nanowires. Like the ITO films, nanostructure-based transparent conductors are particularly useful as electrodes that can be coupled to thin film transistors in electrochromic displays such as flat panel displays and touch screens. In addition, nanostructure-based transparent conductors are also suitable as coatings on color filters and polarizers, as polarizers, and so forth. The above copending applications are incorporated herein by reference in their entireties.

There is a need to provide cost-effective and high-performance nanostructure-based transparent conductors to satisfy the rising demand for quality display systems.

BRIEF SUMMARY

Composite transparent conductors and their applications are described.

One embodiment describes a composite transparent conductor comprising: a primary conductive medium including a plurality of metal nanowires or a plurality of metal nanotubes; and a secondary conductive medium coupled to the primary conductive medium, the secondary conductive medium including a second type of nanostructures or a continuous conductive film.

Another embodiment describes a device, comprising a composite transparent conductor including: a primary conductive medium including a plurality of metal nanowires or a plurality of metal nanotubes; and a secondary conductive medium coupled to the primary conductive medium, the secondary conductive medium being a continuous conductive film.

A further embodiment describes a liquid crystal display cell comprising: a first electrode; and a second electrode, wherein a vertical distance between the first electrode and the second electrode defines a cell gap; wherein the first electrode is a composite transparent conductor including a primary conductive medium and a secondary conductive medium, and wherein, the primary conductive medium includes metal nanowires or metal nanotubes that have a mesh size on the order of the cell gap; and wherein, the secondary conductive medium is a continuous conductive film or a conductive network of nanostructures having a mesh size of about $1/5$ to $1/100$ of the cell gap.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been selected solely for ease of recognition in the drawings.

DETAILED DESCRIPTION OF THE INVENTION

Figure 1:
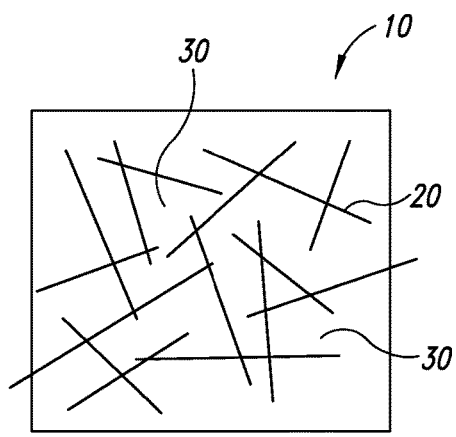
FIG. 1 shows a film of metal nanowires at above electrical percolation level.

Generally speaking, a composite transparent conductor is a conductive film formed of at least two types of transparent conductive media. More specifically, the composite transparent conductor includes metallic anisotropic nanostructures (as described herein) as a primary conductive medium, and a secondary conductive medium coupled to the primary conductive medium. The secondary conductive medium is typically a conductive network of a second type of conductive nanostructures, or a continuous conductive film formed of conductive polymers or metal oxides.

The electrical and optical properties of a composite transparent conductor are determined by factors such as the geometries, conductivities, optical properties, distribution and loading levels of the constituent conductive media.

In certain embodiments, a composite transparent conductor is a layered structure of discrete conductive films. In other embodiments, a composite transparent conductor is a cohesive structure, in which two or more types of conductive media (e.g., two or more types of conductive nanostructures) are fully integrated. Regardless of the structural configurations, composite transparent conductors can exhibit properties beyond the mere additive effects of the constituent conductive media through a judicious selection of such constituent conductive media.

Conductive Nanostructures

In certain embodiments, the composite transparent conductor comprises at least two types of nanostructures, one of which is directed to metallic anisotropic nanostructures. As used herein, "nanostructures" or "conductive nanostructures" generally refer to nano-sized structures, at least one dimension of which is less than 500 nm, more preferably, less than 250 nm, 100 nm, 50 nm or 25 nm.

The nanostructures can be of any shape or geometry. In certain embodiments, the nanostructures are isotropically shaped (i.e., aspect ratio=1). Typical isotropic nanostructures include nanoparticles. In preferred embodiments, the nanostructures are anisotropically shaped (i.e. aspect ratio #1). As used herein, aspect ratio refers to the ratio between the length and the width (or diameter) of the nanostructure. The anisotropic nanostructure typically has a longitudinal axis along its length. Exemplary anisotropic nanostructures include nanowires and nanotubes, as defined herein.

The nanostructures can be solid or hollow. Solid nanostructures include, for example, nanoparticles and nanowires. "Nanowires" refer to solid anisotropic nanostructures, as defined herein. Typically, each nanowire has an aspect ratio (length:diameter) of greater than 10, preferably greater than 50, and more preferably greater than 100. Typically, the nanowires are more than 500 nm, or more than 1 µm, or more than 10 µm in length.

Hollow nanostructures include, for example, nanotubes. "Nanotubes" refer to hollow anisotropic nanostructures, as defined herein. Typically, the nanotube has an aspect ratio (length:diameter) of greater than 10, preferably greater than 50, and more preferably greater than 100. Typically, the nanotubes are more than 500 nm, or more than 1 µm, or more than 10 µm in length.

The nanostructures can be formed of any conductive material. Most typically, the conductive material is metallic.

The metallic material can be an elemental metal (e.g., transition metals) or a metal compound (e.g., metal oxide). The metallic material can also be a metal alloy or a bimetallic material, which comprises two or more types of metal. Suitable metals include, but are not limited to, silver, gold, copper, nickel, gold-plated silver, platinum and palladium. The conductive material can also be non-metallic, such as carbon or graphite (an allotrope of carbon).

As noted above, metallic anisotropic nanostructures are used as the primary conductive medium in a composite transparent conductor. A preferred type of anisotropic metallic nanostructures includes metal nanowires. Metal nanowires are nanowires formed of metal, metal alloys, plated metals or metal oxides. Suitable metal nanowires include, but are not limited to, silver nanowires, gold nanowires, copper nanowires, nickel nanowires, gold-plated silver nanowires, platinum nanowires, and palladium nanowires. Co-pending and co-owned U.S. application Ser. Nos. 11/766,552, 11/504,822, 11/871,767, and 11/871,721 describe methods of preparing metal nanowires (e.g., silver nanowires) and methods of forming and patterning transparent conductors based on metal nanowires, the descriptions of which are incorporated herein by reference in their entireties.

Another preferred type of anisotropic metallic nanostructures used in the primary conductive medium includes metal nanotubes. Co-pending and co-owned U.S. Patent Application No. 61/031,643, filed Feb. 26, 2008, describes methods of preparing metal nanotubes (e.g., gold nanotubes) and methods of forming and patterning transparent conductors based on metal nanotubes, the description of which is incorporated herein by reference in their entireties.

As will be discussed in more detail herein, the metallic anisotropic nanostructures, such as nanowires and nanotubes can be combined with a secondary conductive medium formed by a different type of conductive nanostructures. The secondary conductive medium can be any of following nanostructures, including without limitation, carbon nanotubes, metallic nanowires (or nanotubes) different from the metallic nanowires (or nanotubes) that form the primary conductive medium, conductive nanoparticles and the like.

In certain specific embodiments, the conductive nanostructures forming the secondary conductive medium are carbon nanotubes. Carbon nanotubes are also conductive anisotropic nanostructures. More specifically, "carbon nanotube" refers to a cylinder or tube of rolled up graphene sheet(s). Each graphene sheet comprises $sp^2$ hybridized carbon atoms. Carbon nanotubes can take the form of either single-walled or multi-walled structures, or a mixture of both. A single-walled carbon nanotube (SWNT) is formed by a single rolled-up graphene sheet. Multi-walled carbon nanotubes (MWNTs) are two or more coaxially arranged SWNTs nested in each other. Both SWNTs and MWNTs are known to show metallic and conductive characteristics.

Carbon nanotubes are typically rigid structures of high aspect ratios. The lengths of SWNTs and MWNTs are usually well over 1 µm and diameters range from about 1 nm (for SWNTs) to about 50 nm (for MWNTs). Typically, the aspect ratio of the carbon nanotubes is in the range of about 10-100,000. More typically, the aspect ratio is in the range of about 1,000-10,000. SWNTs are available commercially from Sigma-Aldrich (St. Louis, Mo.).

Carbon nanotubes may be optionally surface treated to prevent aggregation. For example, hydrophilic functional groups may be incorporated onto the surface for better dispersion into the aqueous medium. Various methods of surface treatments are described in Peng H. et al. Sidewall Carboxylic Acid Functionalization of Single-Walled Carbon Nanotubes, *J. Am. Chem. Soc.* 125, 15174-15182, 2003 and Liu J. et al. Fullerene Pipes, *Science,* 280, 1253-1256, 1998.

In further embodiments, the conductive nanostructures are conductive nanoparticles, including metallic nanoparticles such as silver, gold, copper, and nickel nanoparticles, and metal oxide nanoparticles such indium tin oxide and doped zinc oxide nanoparticles. Non-metallic conductive nanoparticles include carbon black, graphene sheets, and the like. These conductive nanoparticles are well known in the art.

Conductive nanostructures can achieve electrical conductivity through continuous physical contact as well as electrical charge tunneling from one nanostructure to another.

Primary Conductive Medium

Metal nanowires or metal nanotubes form the primary conductive medium. Suitable metal nanowires are nanowires formed of metal, metal alloys, plated metals or metal oxides. Suitable metal nanowires include, but are not limited to, silver nanowires, gold nanowires, copper nanowires, nickel nanowires, gold-plated silver nanowires, platinum nanowires, and palladium nanowires. Suitable metal nanotubes include gold nanotubes and those described in U.S. Provisional Application No. 61/031,643.

In various embodiments, the metal nanowires are about 5-100 µm long and 5-100 nm in diameter (or cross-section). In certain embodiments, the metal nanowires are about 5-30 µm long and 20-80 nm in diameter. In a preferred embodiment, the metal nanowires (e.g., silver nanowires) are about 20 µm long and 50 nm in diameter.

Suitable metal nanotubes have similar dimensions as those described for metal nanowires. For nanotubes, the diameter refers to the outer diameter of the nanotubes.

Nanostructures form a conductive network through a percolation process. Percolative conductivity can be established when a conductive path is formed through interconnecting nanostructures. Sufficient nanostructures must be present to reach an electrical percolation threshold and become conductive. The electrical percolation threshold is therefore a critical value related to the loading density or concentration of the nanostructures, above which long range connectivity can be achieved. Typically, the loading density refers to the number of nanostructures per area, which can be represented by "number/$\mu m^2$".

As described in co-pending U.S. patent application Ser. No. 11/504,822, the higher the aspect ratio (length:diameter) of the nanostructures, the fewer nanostructures are needed to achieve percolative conductivity. For anisotropic nanostructures, such as nanowires, the electrical percolation threshold or the loading density is inversely related to the length$^2$ of the nanowires. Co-pending and co-owned application Ser. No. 11/871,053, which is incorporated herein by reference in its entirety, describes in detail the theoretical as well as empirical relationship between the sizes/shapes of the nanowires and the surface loading density at the percolation threshold.

FIG. 1 shows schematically a conductive network 10 formed by nanowires 20 at above an electrical percolation threshold. Conductive paths are formed by interconnecting nanowires (e.g., a path can be traced from one end of the network to the other through connecting nanowires). An electrical current can therefore be carried across the nanowire network 10.

As used herein, "conductive network" or "network" refers to an interconnecting network formed by conductive nanostructures above an electrical percolation threshold. Typically, a conductive network surface resistivity (or "sheet resistance") of no higher than $10^8$ ohms/square (also referred to as "Ω/☐"). Preferably, the surface resistivity is no higher than $10^4$Ω/☐, 3,000Ω/☐, 1,000Ω/☐ or 100Ω/☐. Typically, the surface resistivity of a conductive network formed by metal nanowires is in the ranges of from 10Ω/☐ to 1000Ω/☐, from 100Ω/☐ to 750Ω/☐, 50Ω/☐ to 200Ω/☐, from 100Ω/☐ to 500Ω/☐, or from 100Ω/☐ to 250Ω/☐, or 10Ω/☐ to 200Ω/☐, from 10Ω/☐ to 50Ω/☐, or from 1Ω/☐ to 10Ω/☐.

Also shown in FIG. 1, the networking nanowires define inter-wire spaces 30. At above the percolation threshold, the size of the inter-wire space (also referred to as "mesh size") correlates to the conductivity of the network. Typically, smaller mesh size means more densely distributed nanowires, which in turn correspond to higher conductivity.

Figure 2A:
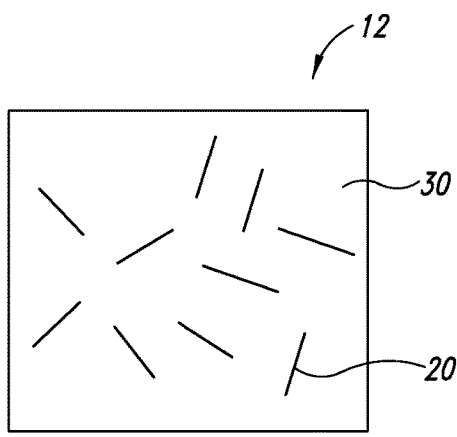
FIG. 2A shows a film of metal nanowires at below electrical percolation level.

Mesh size can also be used as an indicator of the surface loading level. For example, for nanowires of a given length, lower surface loading will result in larger mesh size. When the mesh size is above certain threshold value, the nanowires can become too far apart such that percolation is no longer possible and the inter-wire spaces effectively become insulators. FIG. 2A shows a film 12 in which nanowires 20 are at an insufficient density to form a complete network. The inter-wire spaces 30 become insulating. Stately differently, due to the lower density of the nanowires as compared to that in FIG. 1, the mesh size has enlarged and the conductivity between nanowires disrupted.

Secondary Conductive Medium as Fillers

In a composite transparent conductor, even if the metal nanowires are at a loading level below the electrical percolation threshold, conductivity can be achieved in the presence of the secondary conductive medium. While the metal nanowires of the primary conductive medium can be, in various embodiments, percolative or not percolative, the presence of the second conductive medium provides unexpected or synergistic properties in the composite transparent conductor.

In certain embodiments, the secondary conductive medium includes nanostructures of a different material, dimension, geometry or structure from those of the metal nanowires that form the primary conductive medium. For example, the secondary conductive medium may include, without limitation, carbon nanotubes, metal nanotubes, nanoparticles, and metal nanowires of a different dimension or material.

In other embodiments, the secondary conductive medium can be a continuous conductive film. As used herein, "continuous conductive" refers to an uninterrupted and uniform conductive path across a thin layer (e.g., across a surface or in-plane), in which the electrical conductivity is established by continuous physical contacts of the conductive medium. Examples of continuous conductive films include, without limitation, sputtered or deposited metal oxide films, conductive polymer films, and the like.

Figure 2B:
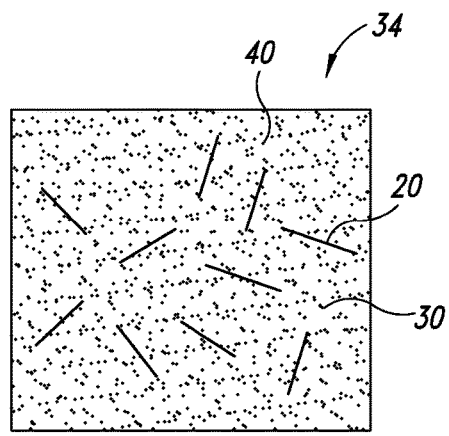
FIG. 2B shows a composite transparent conductor comprising metal nanowires at below electrical percolation level and in combination with a continuous conductive film.

In one respect, the second conductive medium serves to fill in the inter-wire space of a nanowire film. FIG. 2B shows a composite transparent conductor 34, in which a continuous conductive film 40 added to the nanowires 20 of FIG. 2A. The continuous conductive film fills the insulating spaces 30 and effectively eliminates the mesh size.

Figure 2C:
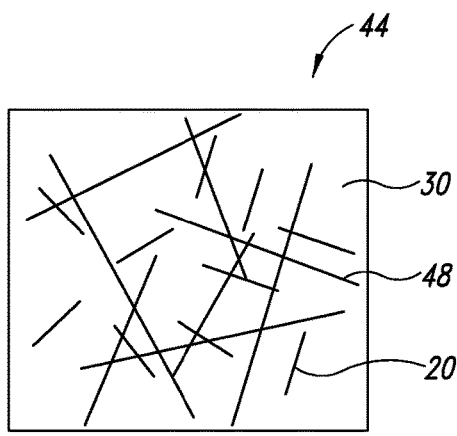
FIG. 2C shows a composite transparent conductor comprising metal nanowires at below electrical percolation level and in combination with a conductive film formed of a second type of anisotropic nanostructures.

FIG. 2C shows another composite transparent conductor 44, in which a plurality of a second type of anisotropic nanostructures 48 is also present. The anisotropic nanostructures 48 are shown as having much higher aspect ratio than the nanowires 20. As shown, the inter-wire space 30 is effectively reduced due to the more efficient connectivity by the longer nanostructures 48.

As shown in FIGS. 2B and 2C, the combined effects of the nanowires and the secondary conductive medium establish conductivity even though the primary conductive medium does not necessarily reach the electrical percolation threshold.

Figure 3A:
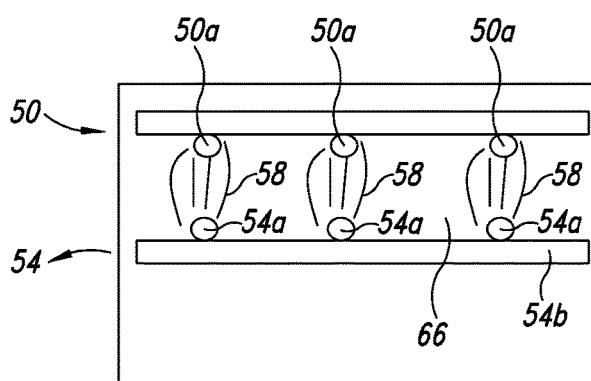
FIG. 3A shows non-uniform electrical field localized between adjacent metal nanowires.
Figure 3B:
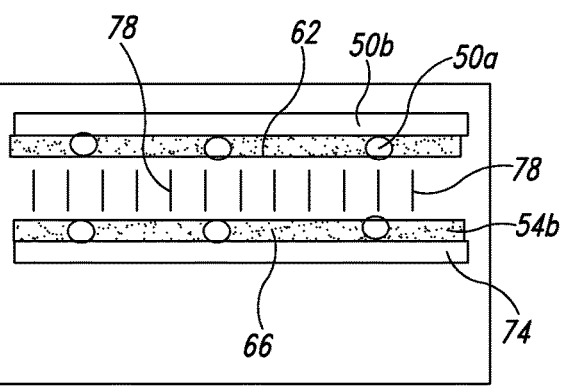
FIG. 3B shows uniform electrical fields in the presence of continuous conductive films.

In a further respect, the presence of the second conductive medium that fills the inter-wire space also serves to equalize the electrical potential distribution in a give transparent conductor. In addition, when two electrodes are spaced apart and an electrical potential is applied, an electrical field is created between the space of the two electrodes. Employing composite transparent conductor as the electrodes serves to enhance the uniformity of the electrical field FIG. 3A shows electric field lines between a top conductive film 50 and a bottom conductive film 54. Both conductive films 50 and 54 are based on nanowires alone. The top conductive film 50 comprises nanowires 50a (shown in cross-sectional view) distributed on a top substrate 50b. Likewise, the bottom conductive film 54 comprises nanowires 54a (also shown in cross-sectional view) distributed on a bottom substrate 54b. The electrical field (shown schematically as line 58) begins from, as an example, nanowires 50a and end at 54a. Due the inter-wire spaces (e.g., 62 and 66) between nanowires in each electrode, the lines 58 are concentrated near the opposing wires. FIG. 3B shows a secondary conductive medium, for example, continuous films 70 and 74 fill in the inter-wire spaces 62 and 66, respectively. As a result, the electrical field, represented by lines 78, is more uniformly distributed.

As the primary conductive medium, highly conductive metal nanowires typically bear the majority of the electrical current in a composite transparent conductor. The secondary conductive medium, although not burdened with current-carrying, nonetheless can form a conductive layer that fills in the space between the metal nanowires. For purpose of this description, the secondary conductive medium forms a conductive layer that has a surface resistivity (or "sheet resistance") of no higher than $10^8$ ohms/square (also referred to as "Ω/☐"). Preferably, the surface resistivity is no higher than $10^4$Ω/☐, 3,000Ω/☐, 1,000Ω/☐ or 100Ω/☐. Typically, the sheet resistance of a continuous conductive film is in the ranges of from 10Ω/☐ to 1000Ω/☐, from 100Ω/☐ to 750Ω/☐, 50Ω/☐ to 200Ω/☐, from 100Ω/☐ to 500Ω/☐, or from 100Ω/☐ to 250Ω/☐, or 10Ω/☐ to 200Ω/☐, from 10Ω/☐ to 50Ω/☐, or from 1Ω/☐ to 10Ω/☐.

In various embodiments, the conductive layer formed by the second conductive medium is optically clear, as defined herein. Further, the presence of the secondary conductive medium may lead to an overall reduction in light scattering. Metal nanowires are reflective structures, which can cause depolarization due to light scattering and reflectivity. Depolarization is one of the main factors that contribute to reducing the contrast ratio in a transparent conductor film, which is typically in a light path of a display device (e.g., flat panel display). Lower contrast ratio tends to adversely affect the image quality of the display device. See, e.g. U.S. Provisional Application No. 61/031,643. In a transparent conductor film solely formed of nanowires, a reduction in the number of the nanowires could result in a reduction in the light scattering, but potentially at the expense of a loss in conductivity. The composite film according to this embodiment allows for a reduction in reflectivity by employing fewer nanowires without necessarily causing a decrease in conductivity due to the supplemental connectivity provided by the second conductive medium.

Moreover, by selecting nanostructures of an appropriate material (e.g., less reflective or non-reflective), a particular dimension (e.g., nanostructures having smaller diameters or cross-sections cause less light scattering), a particular geometry (e.g., nanotubes cause less light scattering than nanowires of the same outer diameter), it is possible to customize composite transparent conductor with optimized optical properties.

Typically, in various embodiments, the conductive layer formed by the second conductive medium is about 100 nm to 200 nm thick, or 50 nm to 100 nm thick, or 150 nm to 200 nm thick.

Composite Transparent Conductor

Thus, a composite transparent conductor comprises metal nanowires as a primary conductive medium and a secondary conductive medium coupled to the primary conductive medium. As used herein, "coupled" refers to the proximate association between the two conductive media and includes physical contact, electrical connection and so forth.

The combined conductive media in the composite provide unexpected attributes or enhanced properties than the sum of the individual conductive medium. As will be described in more detail herein, the synergistic improvements of the composite transparent conductor include, but are not limited to, more equalized electrical potential in a composite transparent conductor, a more uniform electrical field between two electrodes form by the composite transparent conductor, higher conductivity, better durability, higher contrast ratio and so forth. In addition, when combining nanowires with a judicious selection of the secondary conductive medium, the overall fabrication cost can be reduced without compromising the performance standard of the composite transparent conductor.

The following specific embodiments describe composite transparent conductors based on metal nanowires as a primary conductive medium and various secondary conductive media.

1. Carbon Nanotube Film as the Secondary Conductive Medium

In another embodiment, the composite transparent conductor comprises a plurality of metal nanowires combined with a secondary conductive medium, wherein the secondary conductive medium is a continuous conductive film formed of carbon nanotubes (CNT).

Figure 4A:
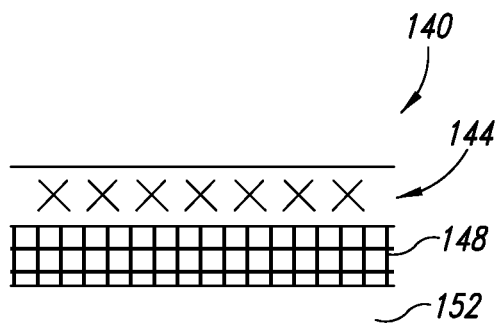
FIG. 4A-4C show embodiments of composite transparent conductors based on metal nanowires and carbon nanotubes.
Figure 4B:
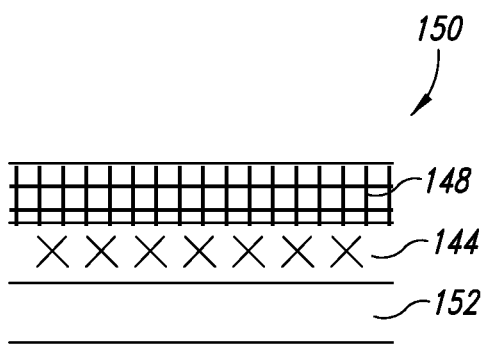
Figure 4C:
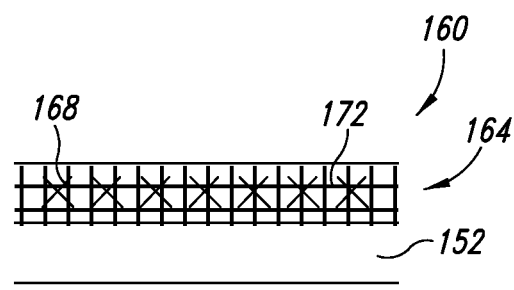

FIG. 4A shows a composite transparent conductor 140 including a nanowire layer 144 and an underlying CNT layer 148 formed on a substrate 152. The CNTs form a conductive film underlying the nanowire layer. FIG. 4B shows a composite transparent conductor 150 having a reverse arrangement of the constituent films, in which the nanowire layer 144 underlies the CNT layer 148. In both FIGS. 4A and 4B, the constituent films can be deposited sequentially. Alternatively, nanowires and CNTs can also be co-deposited simultaneously and forms a fully integrated conductive film. FIG. 4C shows a composite transparent conductor 160 having a conductive layer 164 in which nanowires 168 and CNTs 172 are fully integrated to afford a cohesive structure.

The composite films shown in FIGS. 4A-4C provide long range connectivity that relies on the complementary properties of the highly conductive metal nanowires to carry an electrical current, and the filling effects of the conductive CNT film. Because the CNTs have much lower specific weight (about 1.7-1.9 $g/cm^3$) compared to metal nanowires (about 10.5 $g/cm^3$ for silver nanowires), at a given loading level, CNTs can form a conductive film with smaller mesh sizes as compared to metal nanowires. Thus, composite transparent conductors having a CNT layer can also improves the uniformity of the electrical potential of the composite film when connected to a power source.

In addition, the CNTs are black and have very narrow dimension (i.e., their diameters or cross-sectional areas are typically less than 2 nm), which are desirable conditions for reducing light scattering and improving contrast ratio. As a result, the combined conductive media based on CNTs and metal nanowires reduce the overall reflectivity at a given conductivity.

Moreover, a composite film based on CNTs and nanowires are particularly suitable as via contacts. As used herein, "via" refers to the connection between two conductors, typically through a dielectric layer. As discussed, because the CNTs have much lower specific weight than that of the metal nanowires, the loading density of the CNTs can be much higher per unit area than metal nanowires of the same weight. This can be advantageously applied to via contacts, which are burdened with supporting high current densities in a confined area (about 5-10 microns). The larger density of the CNTs can effectively carry the additional current and prevent potential damages to the metal nanowires.

In certain embodiments, a third conductive medium can be further incorporated into the composite transparent conductor. As used herein, "second type of nanostructures" and "third type nanostructures" specifically refer to nanostructures that are different from each other as well as from the metal nanowires or metal nanotubes that form the primary conductive medium in at least one respect, such as the material, the dimension, the shape, or the geometry of the nanostructure.

Suitable third conductive medium includes conductive nanostructures such as conductive nanoparticles, conductive nanostructures of a different material, dimension or geometry from those of the metal nanowires of the primary conductive medium. For example, conductive nanoparticles can be metallic nanoparticles, metal oxide nanoparticles, carbon blacks, and a combination thereof. Conductive nanostructures can be nanowires of a different metal, nanotubes, or nanowires of a higher aspect ratio or a smaller cross-section. The third type of conductive nanostructures that are distributed throughout the composite transparent conductor can supplement the filling effect of the CNTs and contribute to rendering a more equalized electrical potential across the composite transparent conductor.

Typically, the composite transparent conductor based on a combination of metal nanowires (e.g., silver nanowires) and a CNT film has a light transmission of at least 50%, at least 60%, at least 70%, or at least 80%, or at least 85%, or at least 90%, or at least 95% (using air as reference).

Typically, the composite transparent conductor based on a combination of metal nanowires (e.g., silver nanowires) and a CNT film has a sheet resistance in the range from $1-10^8 \Omega/\square$, depending on the end application of the composite transparent conductor. More typically, the sheet resistance is in the ranges of from $10\Omega/\square$ to $1000\Omega/\square$, from $100\Omega/\square$ to $750\Omega/\square$, $50\Omega/\square$ to $200\Omega/\square$, from $100\Omega/\square$ to $500\Omega/\square$, or from $100\Omega/\square$ to $250\Omega/\square$, or $10\Omega/\square$ to $200\Omega/\square$, from $10\Omega/\square$ to $50\Omega/\square$, or from $1\Omega/\square$ to $10\Omega/\square$.

In preferred embodiments, the composite transparent conductor based on a combination of metal nanowires (e.g., silver nanowires) and a CNT film has a light transmission higher than 85% and a sheet resistance of less than $1000\Omega/\square$. In other embodiments, the composite transparent conductor based on a combination of metal nanowires (e.g., silver nanowires) and a CNT film has a light transmission higher than 95% and a sheet resistance of less than $500\Omega/\square$. In other embodiments, the composite transparent conductor based on a combination of metal nanowires (e.g., silver nanowires) and a CNT film has a light transmission higher than 90% and a sheet resistance of less than $100\Omega/\square$. In other embodiments, the composite transparent conductor based on a combination of metal nanowires (e.g., silver nanowires) and a CNT film has a light transmission higher than 85% and a sheet resistance of less than $50\Omega/\square$.

2. Other Types of Nanostructures as the Secondary Conductive Medium

Nanostructures other than CNTs are also suitable as the second conductive medium. In certain embodiments, the conductive nanostructures are metal nanowires of a different material or dimension from the metal nanowires that form the primary conductive medium. For example, nanowires formed of a less reflective metal or having a less reflective oxide sheath can be used to reduce light scattering without compromising the overall conductivity of the composite transparent conductor. Further, nanowires having a smaller diameter (i.e., cross-sectional area) compared to that of the metal nanowires of the primary conductive medium can also reduce light scattering.

Figure 5:
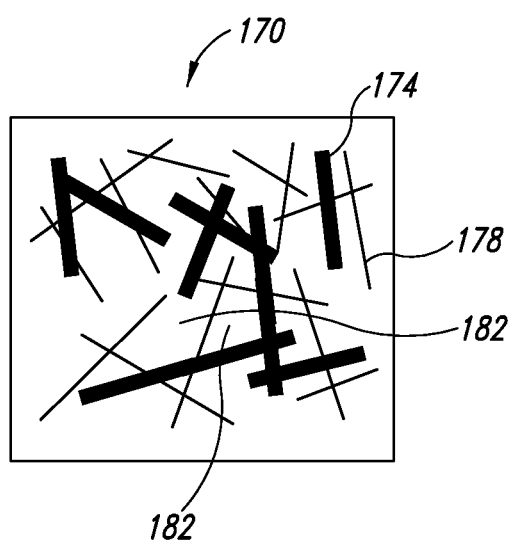
FIG. 5 shows a composite transparent conductor having two different types of metal nanowires differs in their dimensions.

FIG. 5 shows a composite transparent conductor 170 comprising a first type of nanowires 174 as the primary conductive medium and a second type of nanowires 188. The second type of nanowires 188 has a much smaller diameter than that of the first type of nanowires 174. As a result, the secondary conductive medium not only facilitates the conductivity of the composite transparent conductor by filling in the inter-wire space 182 but also do not substantially contribute to light scattering due to their narrow dimensions.

In various other embodiments, the second type of nanostructures can be metal nanotubes, conductive nanoparticles (such as carbon blacks and metal or metal oxide nanoparticles), and the like.

3. Metal Oxide Film as the Secondary Conductive Medium

In one embodiment, the composite transparent conductor comprises a plurality of metal nanowires combined with a secondary conductive medium, wherein the secondary conductive medium is a conductive metal oxide film. Conductive metal oxides such as indium tin oxide (ITO) are well known in the art. Sputtered ITO films have been conventionally applied to devices that employ transparent conductors. However, the ITO films are limited in their applications due to their brittleness and low tolerance to stress. Even minute fractures in an ITO film can cause a rapid loss of conductivity.

Figure 6A:
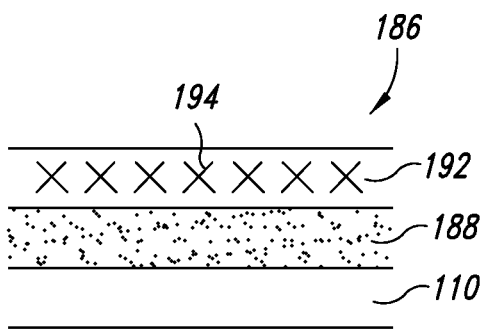
FIG. 6A-6B show embodiments of composite transparent conductors based on metal nanowires and metal oxide films.

Combining a metal nanowire-based film and an ITO film affords a composite film having synergistic advantages. FIG. 6A shows a composite film 186 comprises an ITO film 188 on a substrate 110 (e.g., glass), and a nanowire film 192 positioned on top of the ITO film 188, the nanowire film 192 comprising nanowires 194.

In one embodiment, the loading density of the nanowires 194 is below the electrical percolation threshold. Nevertheless, surface conductivity can be established in the composite film 186 by the combination of the nanowires and the underlying ITO film 188. As discussed, the ITO film is capable of filling in any insulating gap between the nanowires.

Figure 6B:
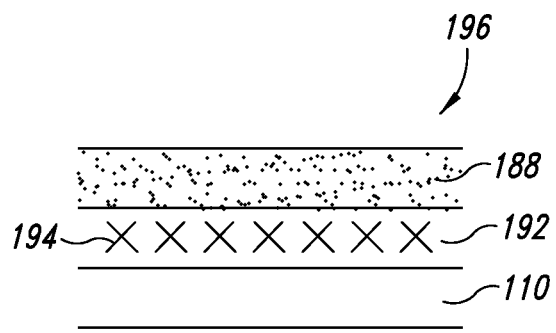

FIG. 6B shows a composite film 196 having an alternative arrangement of the nanowire-based film and the ITO film. As shown, the nanowire film 192 is first deposited on the substrate 110. The ITO film 188 is sputtered on top of the nanowire film 192. As in FIG. 6A, the nanowires 194 do not necessarily form a conductive network themselves. Nevertheless, in-plane conductivity can be established in the composite film 196 by the combination of the nanowires and the overlying ITO film 188.

As shown, conductivity throughout the composite film, including surface and in-plane conductivity, can be superior to that of either constituent film alone, i.e., the nanowire-based film and the ITO film. Advantageously, the constituent films complement each other to synergistically provide properties that are more than the mere additive effects of the constituent films. For example, due to the presence of a continuous ITO film, when connected to a voltage source, the composite film has a more uniform electrical potential than that of a transparent conductor based on nanowires alone (see, also, FIG. 2B). On the other hand, the nanowires allow for certain degrees of flexing in the composite film without causing loss in conductivity. For example, the nanowires can bridge minor fractures within the bulk of the ITO film and maintain conductivity, thus preventing potential failures in the composite film when in physical stress.

In addition, because of the high conductivity of the nanowires, the conductivity of the composite film can be much higher compared to that of a pure ITO film at the same thickness. It is therefore possible to produce a composite film that has a thinner ITO film as a constituent than a pure ITO film, yet is capable of reaching the same level of conductivity as the pure, thicker ITO film. Reducing the thickness of an ITO film can directly result in a reduction in fabrication cost, and result in an ITO film that is less prone to fracture.

Figure 6C:
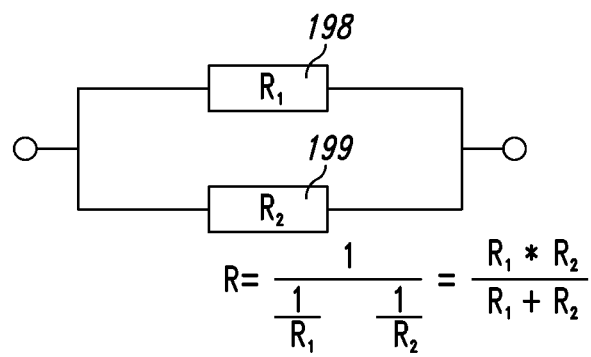
FIG. 6C shows schematically a pair of parallel resistors.

Moreover, although the constituent films of FIGS. 6A and 6B are in an arrangement that resembles two parallel resistors, it is observed that the resistivity of the composite film can be lower than the resistivity expected for the parallel resistors (see, also, Example 4). FIG. 6C schematically shows two parallel resistors 198 (resistivity R1) and 199 (resistivity R2). As known, the overall resistivity R of a set of parallel resistors is:

$$R=(R1 \times R2)/(R1+R2)$$

Example 4 measures the resistivity of the composite film formed by an ITO film having a resistivity of 250Ω/□ and a nanowire-based film having a resistivity of about 250Ω/□. If these two constituent films are merely parallel resistors, the overall resistivity would have been about 125Ω/□. However, it was observed that the resistivity of the composite film was in the range of about 50-80Ω/□, which was much lower than the expected resistivity of ITO film (250Ω/□) and nanowire film (250Ω/□) as parallel resistors.

Optically, the composite film can be less reflective than a nanowire-based film alone at a given conductivity level. As discussed, in a transparent conductor film solely formed of nanowires, a reduction in the number of the nanowires could result in a reduction in light scattering in the transparent conductor, but potentially at the expense of a loss in conductivity. The composite film according to this embodiment allows for a reduction in light scattering by employing fewer nanowires without necessarily causing a decrease in conductivity due to the supplemental connectivity provided by the ITO film.

Other metal oxide films can be used in the place of the ITO film of FIGS. 6A and 6B. Exemplary metal oxide films include doped zinc oxide film, fluorine doped tin oxide film, aluminum doped zinc oxide film, $Zn_2SnO_4$, $ZnSnO_3$, $MgIn_2O_4$, $GaInO_3$, $(Ga_2In)_2O_3$, $Zn_2In_2O_5$, $In_4Sn_3O_{12}$ and so forth. Crawford, G. P., Flexible Flat Panel Display (John Wiley and Sons, 2005).

Typically, the composite transparent conductor based on a combination of metal nanowires (e.g., silver nanowires) and a metal oxide film has a light transmission of at least 50%, at least 60%, at least 70%, or at least 80%, or at least 85%, or at least 90%, or at least 95% (using air as reference).

Typically, the composite transparent conductor based on a combination of metal nanowires (e.g., silver nanowires) and a metal oxide film has a sheet resistance in the range from $1\text{-}10^8 \Omega/\square$, depending on the end application of the composite transparent conductor. More typically, the sheet resistance is in the ranges of from 10Ω/□ to 1000Ω/□, from 100Ω/□ to 750Ω/□, 50Ω/□ to 200Ω/□, from 100Ω/□ to 500Ω/□, or from 100Ω/□ to 250Ω/□, or 10Ω/□ to 200Ω/□, from 10Ω/□ to 50Ω/□, or from 1Ω/□ to 10Ω/□.

In preferred embodiments, the composite transparent conductor based on a combination of metal nanowires (e.g., silver nanowires) and a metal oxide film has a light transmission higher than 85% and a sheet resistance of less than 1000Ω/□. In other embodiments, the composite transparent conductor based on a combination of metal nanowires (e.g., silver nanowires) and a metal oxide film has a light transmission higher than 95% and a sheet resistance of less than 500Ω/□. In other embodiments, the composite transparent conductor based on a combination of metal nanowires (e.g., silver nanowires) and a metal oxide film has a light transmission higher than 90% and a sheet resistance of less than 100Ω/□. In other embodiments, the composite transparent conductor based on a combination of metal nanowires (e.g., silver nanowires) and a metal oxide film has a light transmission higher than 85% and a sheet resistance of less than 50 Ω/□.

4. Conductive Polymer Film as the Secondary Conductive Medium

In another embodiment, the composite transparent conductor comprises a plurality of metal nanowires combined with a secondary conductive medium, wherein the secondary conductive medium is a continuous polymer film.

Certain polymers are conductive due to electronic delocalization throughout a conjugated backbone of continuous overlapping orbitals. For example, polymers formed of alternating single and double carbon-carbon bonds can provide a continuous path of overlapping p orbitals in which the electrons can occupy.

Common classes of organic conductive polymers include, with limitation, poly(acetylene)s, poly(pyrrole)s, poly(thiophene)s, poly(aniline)s, poly(fluorene)s, poly(3-alkylthiophene)s, poly(3,4-ethylenedioxythiophene), also known as PEDOT, polytetrathiafulvalenes, polynaphthalenes, polyparaphenylene, poly(paraphenylene sulfide), and poly(paraphenylene vinylene)s.

Although a conductive polymer film alone is typically not conductive or physically robust enough to function as a transparent conductor in a display device, the conductive polymer film can be combined or doped with metal nanowires to form a composite transparent conductor. The composite transparent conductor can rely on the metal nanowires as the principle current-carrying medium and the conductive polymer film as a filler to even out the electrical field. In addition, the metal nanowires can also reinforce and strengthen the mechanical properties of the conductive polymer films.

Optically, the conductive polymer film can also adjust the absorption characteristics of the composition film.

Figure 7A:
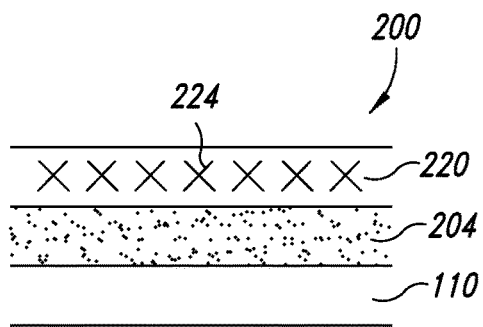
FIG. 7A-7B show embodiments of composite transparent conductors based on metal nanowires and conductive polymer films.

FIG. 7A shows a composite film 200 comprises a conductive polymer film 204 on a substrate 110 (e.g., glass), and a nanowire film 220 positioned on top of the conductive polymer film 204.

Figure 7B:
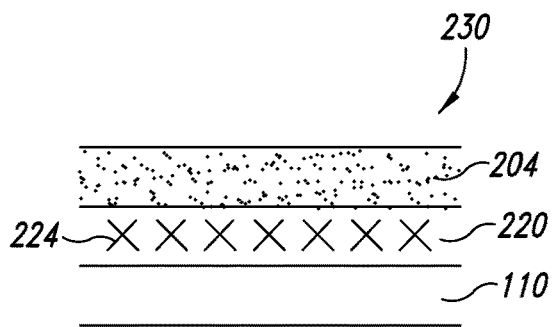

FIG. 7B shows a composite film 230 having an alternative arrangement of the nanowire-based film and the conductive polymer film. As shown, the nanowire film 220 is first deposited on the substrate 110. The conductive polymer film 104 is deposited on top of the nanowire film 220. As in FIG. 6A, the nanowires 224 do not necessarily form a conductive network themselves. Nevertheless, in-plane conductivity can be established in the composite film 230 by the combination of the nanowires and the overlying conductive polymer film 204.

In an alternative embodiment, the metal nanowires are first deposited on the substrate and form a conductive network. The conductive polymer film can be formed in situ using the metal nanowires network as an electrode. An example of suitable conductive polymers that can be formed in situ is polypyrrole. More specifically, using nanowire-based conductive network as an electrode (i.e., an anode), pyrrole monomers can electrochemically polymerize and form a coating on the conductive network. The conductive polymer film can also be formed chemically in the presence of an oxidative agent according to known methods in the art. The resulting composite transparent conductor features nanowires embedded in a conductive polymer film.

Typically, the composite transparent conductor based on a combination of metal nanowires (e.g., silver nanowires) and a conductive polymer film has a light transmission of at least 50%, at least 60%, at least 70%, or at least 80%, or at least 85%, or at least 90%, or at least 95% (using air as reference).

Typically, the composite transparent conductor based on a combination of metal nanowires (e.g., silver nanowires) and a conductive polymer film has a sheet resistance in the range from $1\text{-}10^8\Omega/\square$, depending on the end application of the composite transparent conductor. More typically, the sheet resistance is in the ranges of from $10\Omega/\square$ to $1000\Omega/\square$, from $100\Omega/\square$ to $750\Omega/\square$, $50\Omega/\square$ to $200\Omega/\square$, from $100\Omega/\square$ to $500\Omega/\square$, or from $100\Omega/\square$ to $250\Omega/\square$, or $10\Omega/\square$ to $200\Omega/\square$, from $10\Omega/\square$ to $50\Omega/\square$, or from $1\Omega/\square$ to $10\ \Omega/\square$.

In preferred embodiments, the composite transparent conductor based on a combination of metal nanowires (e.g., silver nanowires) and a conductive polymer film has a light transmission higher than 85% and a sheet resistance of less than $1000\Omega/\square$. In other embodiments, the composite transparent conductor based on a combination of metal nanowires (e.g., silver nanowires) and a conductive polymer film has a light transmission higher than 95% and a sheet resistance of less than $500\Omega/\square$. In other embodiments, the composite transparent conductor based on a combination of metal nanowires (e.g., silver nanowires) and a conductive polymer film has a light transmission higher than 90% and a sheet resistance of less than $100\Omega/\square$. In other embodiments, the composite transparent conductor based on a combination of metal nanowires (e.g., silver nanowires) and a conductive polymer film has a light transmission higher than 85% and a sheet resistance of less than $50\Omega/\square$.

Electrical and Optical Properties

As discussed herein, the combined conductive media in the composite transparent conductor provide unexpected attributes or enhanced properties than the sum of the individual conductive medium. These synergistic improvements of the composite transparent conductor include, but are not limited to, more uniform electrical potential (when connected to a power source), higher conductivity, better durability, higher contrast ratio and so forth.

Typically, the composite transparent conductor based on a combination of metal nanowires (e.g., silver nanowires) and a secondary conductive medium has a light transmission of at least 50%, at least 60%, at least 70%, or at least 80%, or at least 85%, or at least 90%, or at least 95% (using air as reference). Haze is an index of light scattering. It refers to the percentage of the quantity of light separated from the incident light and scattered during transmission (i.e., transmission haze). Unlike light transmission, which is largely a property of the medium, haze is often a production concern and is typically caused by surface roughness and embedded particles or compositional heterogeneities in the medium. In various embodiments, the haze of the transparent conductor is no more than 10%, no more than 8%, no more than 5%, no more than 3% or no more than 1%.

Typically, the composite transparent conductor based on a combination of metal nanowires (e.g., silver nanowires) and a secondary conductive medium has a sheet resistance in the range from $1\text{-}10^8\Omega/\square$, depending on the end application of the composite transparent conductor. More typically, the sheet resistance is in the ranges of from $10\Omega/\square$ to $1000\Omega/\square$, from $100\Omega/\square$ to $750\Omega/\square$, $50\Omega/\square$ to $200\Omega/\square$, from $100\Omega/\square$ to $500\Omega/\square$, or from $100\Omega/\square$ to $250\Omega/\square$, or $10\Omega/\square$ to $200\Omega/\square$, from $10\Omega/\square$ to $50\Omega/\square$, or from $1\Omega/\square$ to $10\ \Omega/\square$.

In preferred embodiments, the composite transparent conductor based on a combination of metal nanowires (e.g., silver nanowires) and secondary conductive medium has a light transmission higher than 85% and a sheet resistance of less than $1000\Omega/\square$. In other embodiments, the composite transparent conductor based on a combination of metal nanowires (e.g., silver nanowires) and a secondary conductive medium has a light transmission higher than 95% and a sheet resistance of less than $500\Omega/\square$. In other embodiments, the composite transparent conductor based on a combination of metal nanowires (e.g., silver nanowires) and a secondary conductive medium has a light transmission higher than 90% and a sheet resistance of less than $100\Omega/\square$. In other embodiments, the composite transparent conductor based on a combination of metal nanowires (e.g., silver nanowires) and a secondary conductive medium has a light transmission higher than 85% and a sheet resistance of less than $50\Omega/\square$.

The composite transparent conductor described herein can possess electrical and optical properties suitable as electrodes in flat panel displays. A typical range of sheet resistances for transparent electrodes in a flat panel display is about $10\text{-}100\Omega/\square$ with a transmission of the layer of higher than 87% (when used glass as reference) or higher than 95% (when using air as reference).

Figure 8:
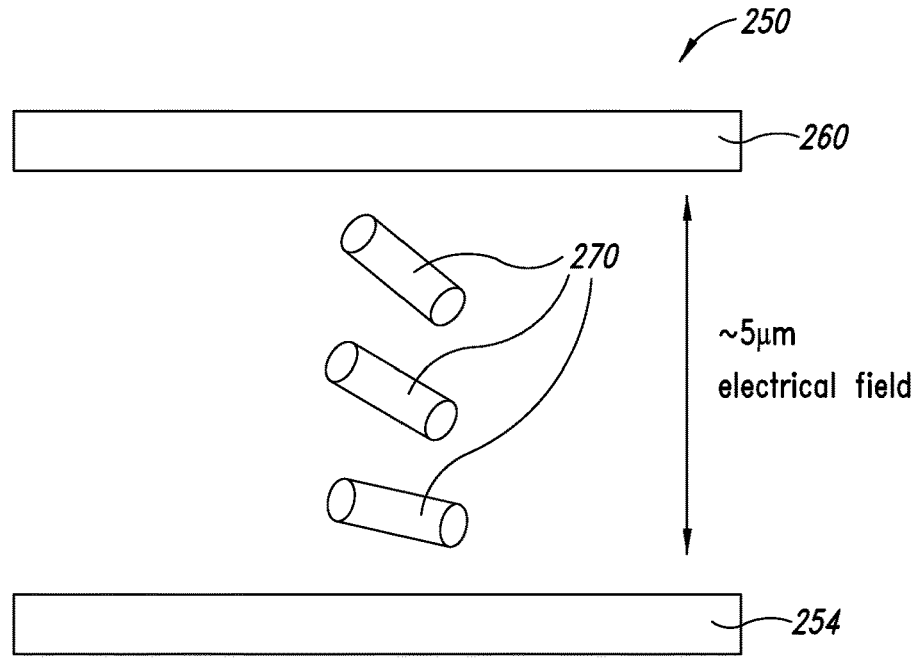
FIG. 8 illustrates schematically a liquid crystal material positioned between two transparent electrodes.
Figure 9:
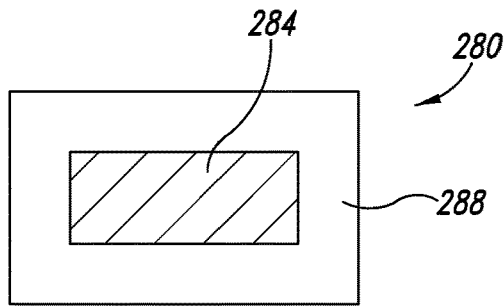
FIG. 9 shows a device incorporating a composite transparent conductor.

Moreover, when used as electrodes, the composite transparent conductors provide uniform electrical fields that are particularly advantageous in a liquid crystal display (LCD). FIG. 8 shows schematically a LCD set-up 250, in which pixel electrode 254 and counter electrode 260 are spaced apart by about 3-5 µm, also referred to as "cell gap". Liquid crystal cells 270 are positioned between the two electrodes. Simply stated, an LCD operates when liquid crystal molecules confined in a cell change their conformation in response to an applied electric field generated between two electrodes.

Using transparent conductor electrodes formed solely of nanowires, at the desired level of conductivity and light transmission, the spaces between the nanowires may be comparable to the liquid crystal cell cap (i.e., "cell gap"). Thus, it is possible that not all of the liquid crystal molecules in the cell will be driven by the same electrical field (both magnitude and direction), causing undesired local nonuniformity in the optical properties of the cell.

Employing composite transparent conductors as the electrodes, however, effectively reduces or eliminates the space between the nanowires. Typically, the mesh size between the nanowires should be less than ⅕ of the liquid crystal cell gap. More typically, the mesh size should be less than 1/10 or 1/100 of the cell gap. The presence of the secondary conductive medium enables a uniform electrode field be applied across the liquid crystal cell, resulting in a uniform orientation of the liquid crystal molecules and therefore a homogeneous optical response.

As shown, if an electrode in the LCD cell comprises only nanowires, a surface loading level to afford mesh sizes of 1/5-1/100 of cell gap will result in poor optical properties, including high haze and low contrast ratio. However, when composite transparent conductor is used as the electrode, the metal nanowires (or metal nanotubes) of the primary conductive medium can maintain a mesh size on the order of the cell gap, while the secondary conductive medium effectively reduces the mesh size to about 1/5-1/100 of the cell gap, or eliminates the mesh size, as in the case of the continuous conductive film. The resulting LCD cell will have improved cell performance as the optical properties of the electrodes improve.

Thus, one embodiment provides a liquid crystal cell a first electrode; and a second electrode, wherein a vertical distance between the first electrode and the second electrode defines a cell gap; wherein the first electrode is a composite transparent conductor including a primary conductive medium and a secondary conductive medium, and wherein, the primary conductive medium includes metal nanowires or metal nanotubes that have a mesh size on the order of the cell gap; and wherein, the secondary conductive medium is a continuous conductive film or a conductive network of nanostructures having a mesh size of about 1/5 to 1/100 of the cell gap.

Typically, the cell gap is about 3-5 μm. In certain embodiments, the conductive network of nanostructures have a mesh size of about 1/5 to 1/10 of the cell gap, or about 1/10 to 1/100 of the cell gap.

Any of the above described composite transparent conductor can be used as the first electrode of the liquid crystal cell. For example, in various embodiments, the primary conductive medium can metal nanowires (e.g., silver nanowires) or metal nanotubes (e.g., gold nanotubes). In preferred embodiments, the metal nanowires or metal nanotubes are 20-80 nm in diameter (outer diameter for nanotubes) and 5-30 μm long.

The secondary conductive medium may include a conductive network of carbon nanotubes, metal nanowires different from the metal nanowires of the primary conductive medium, or metal nanotubes different from the metal nanotubes of the primary conductive medium.

Alternatively, the secondary conductive medium can be a continuous conductive film such as a metal oxide film (e.g., ITO film) or a conductive polymer film (e.g., PEDOT film).

In a further embodiment, the second electrode can also be a composite transparent conductor, as described herein.

In certain embodiments, the first electrode has a light transmission of 80-95%.

As discussed, the composite transparent conductors can be designed to reduce undesirable level of scattering typically associated with metal nanowires. Because the secondary conductive medium is current-carrying, fewer nanowires are required to achieve a given conductivity. In addition, the secondary conductive medium described here is typically non-reflective, low-reflective, or comprises nanostructures having small scattering cross-sections; as a result, the overall scattering diminishes because fewer nanowires are present.

Additional Layers

In a further embodiment, an inert layer of overcoat can be deposited to stabilize and protect the composite transparent conductor. The overcoat can also provide favorable optical properties, such as anti-glare and anti-reflective properties, which serve to further reduce the reflectivity of the nanoparticles.

Thus, the overcoat can be one or more of a hard coat, an anti-reflective layer, a protective film, a barrier layer, and the like, all of which are extensively discussed in co-pending application Ser. Nos. 11/871,767 and 11/504,822.

Examples of suitable hard coats include synthetic polymers such as polyacrylics, epoxy, polyurethanes, polysilanes, silicones, poly(silico-acrylic) and so on. Suitable anti-glare materials are well known in the art, including without limitation, siloxanes, polystyrene/PMMA blend, lacquer (e.g., butyl acetate/nitrocellulose/wax/alkyd resin), polythiophenes, polypyrroles, polyurethane, nitrocellulose, and acrylates, all of which may comprise a light diffusing material such as colloidal or fumed silica. Examples of protective film include, but are not limited to: polyester, polyethylene terephthalate (PET), polybutylene terephthalate, polymethyl methacrylate (PMMA), acrylic resin, polycarbonate (PC), polystyrene, triacetate (TAC), polyvinyl alcohol, polyvinyl chloride, polyvinylidene chloride, polyethylene, ethylene-vinyl acetate copolymers, polyvinyl butyral, metal ion-crosslinked ethylene-methacrylic acid copolymers, polyurethane, cellophane, polyolefins or the like; particularly preferable are PET, PC, PMMA, or TAC.

Patterning

The composite transparent conductor described herein can be patterned depending on their end uses. Any known methods in the art and all of the patterning methods described in co-owned and co-pending U.S. patent application Ser. Nos. 11/504,822, 11/871,767, can be used to pattern the composite transparent conductor.

Applications of the Composite Transparent Conductor

The composite transparent conductor described herein can be used as functional films such as transparent electrodes, polarizers, color filters in a wide variety of devices, including all the devices that currently makes use of metal oxide films (e.g., ITO). FIG. 7 shows schematically a device 250 including a composite transparent conductor 254 in a housing 258. The composite transparent conductor can be any of the above described configurations or combinations of the primary conductive medium (i.e., a plurality of metal nanowires) and the second conductive medium (i.e., a continuous conductive film).

Examples of suitable devices include flat panel displays such as LCDs, plasma display panels (PDP), coatings on color filters for colored flat panel displays, touch screens, electromagnetic interference, electromagnetic shielding, functional glasses (e.g., for electrochromic windows), optoelectronic devices including EL lamps and photovoltaic cells, and the like. In addition, the transparent conductors herein can be used in flexible devices, such as flexible displays and touch screens. See, co-pending application Ser. No. 11/871,767.

EXAMPLES

Example 1

Synthesis of Silver Nanowires

Silver nanowires were synthesized by a reduction of silver nitrate dissolved in ethylene glycol in the presence of poly(vinyl pyrrolidone) (PVP). The method was described in, e.g. Y. Sun, B. Gates, B. Mayers, & Y. Xia, "Crystalline silver nanowires by soft solution processing", *Nanolett*, (2002), 2(2) 165-168. Uniform silver nanowires can be selectively isolated by centrifugation or other known methods.

Alternatively, uniform silver nanowires can be synthesized directly by the addition of a suitable ionic additive (e.g., tetrabutylammonium chloride) to the above reaction mixture. The silver nanowires thus produced can be used directly without a separate step of size-selection. This synthesis is described in more detail in U.S. Provisional Application No. 60/815,627, in the name of Cambrios Technologies Corporation, the assignee of the present application, which application is incorporated herein in it entirety.

In the following examples, silver nanowires of 70 nm to 80 nm in width and about 8 µm-25 µm in length were used. Typically, better optical properties (higher transmission and lower haze) can be achieved with higher aspect ratio wires (i.e. longer and thinner).

Example 2

Preparation of Composite Transparent Conductors

The metal nanowires can be formulated into an ink composition prior to deposition on a substrate or a continuous conductive film such as ITO film, and conductive polymer films.

An ITO film can be directly sputtered on a substrate followed by the deposition of the nanowire layer. Alternatively, a nanowire layer can be first deposited on a substrate, followed by sputtering an ITO film directly on the nanowire layer.

If the secondary conductive medium includes carbon nanotubes, the carbon nanotubes can be formulated into the same ink composition with the metal nanowires for co-deposition. Alternatively, the carbon nanotubes can be formulated into a separate ink composition for serial deposition before or after the deposition of the metal nanowires.

Typically, the ink composition comprises agents that facilitate dispersion of the nanostructures and/or immobilization of the nanostructures on the substrates. These agents include surfactants, viscosity modifiers, and the like. Detailed description of formulating the ink compositions can be found in co-pending U.S. patent application Ser. No. 11/504,822, which is incorporated herein by reference in its entirety.

A typical ink composition for depositing metal nanowires comprises, by weight, from 0.0025% to 0.1% surfactant (e.g., a preferred range is from 0.0025% to 0.05% for Zonyl® FSO-100), from 0.02% to 4% viscosity modifier (e.g., a preferred range is 0.02% to 0.5% for hydroxypropylmethylcellulose or HPMC), from 94.5% to 99.0% solvent and from 0.05% to 1.4% metal nanowires. Representative examples of suitable surfactants include Zonyl® FSN, Zonyl® FSO, Zonyl® FSH, Triton (x100, x114, x45), Dynol (604, 607), n-Dodecyl b-D-maltoside and Novek. Examples of suitable viscosity modifiers include hydroxypropyl methyl cellulose (HPMC), methyl cellulose, xanthan gum, polyvinyl alcohol, carboxy methyl cellulose, hydroxy ethyl cellulose. Examples of suitable solvents include water and isopropanol.

The ink composition can be prepared based on a desired concentration of the nanowires, which is an index of the loading density of the final conductive film formed on the substrate.

The substrate can be any material onto which nanowires are deposited. The substrate can be rigid or flexible. Preferably, the substrate is also optically clear, i.e., light transmission of the material is at least 80% in the visible region (400 nm-700 nm).

Examples of rigid substrates include glass, polycarbonates, acrylics, and the like. In particular, specialty glass such as alkali-free glass (e.g., borosilicate), low alkali glass, and zero-expansion glass-ceramic can be used. The specialty glass is particularly suited for thin panel display systems, including Liquid Crystal Display (LCD).

Examples of flexible substrates include, but are not limited to: polyesters (e.g., polyethylene terephthalate (PET), polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, polyimides, silicones and other conventional polymeric films.

The ink composition can be deposited on the substrate according to, for example, the methods described in co-pending U.S. patent application Ser. No. 11/504,822.

As a specific example, an aqueous dispersion of silver nanowires, i.e., an ink composition was first prepared. The silver nanowires were about 35 nm to 45 nm in width and around 10 µm in length. The ink composition comprises, by weight, 0.2% silver nanowires, 0.4% HPMC, and 0.025% Triton x100. The ink was then spin-coated on glass at a speed of 500 rpm for 60 s, followed by post-baking at 50° C. for 90 seconds and 180° for 90 seconds. The coated film had a resistivity of about 20 ohms/sq, with a transmission of 96% (using glass as a reference) and a haze of 3.3%.

As understood by one skilled in the art, other deposition techniques can be employed, e.g., sedimentation flow metered by a narrow channel, die flow, flow on an incline, slit coating, gravure coating, microgravure coating, bead coating, dip coating, slot die coating, and the like. Printing techniques can also be used to directly print an ink composition onto a substrate with or without a pattern. For example, inkjet, flexoprinting and screen printing can be employed.

It is further understood that the viscosity and shear behavior of the fluid as well as the interactions between the nanowires may affect the distribution and interconnectivity of the nanowires deposited.

Example 3

Evaluation of Optical and Electrical Properties of Transparent Conductors

The composite transparent conductors prepared according to the methods described herein were evaluated to establish their optical and electrical properties.

The light transmission data were obtained according to the methodology in ASTM D1003. Haze was measured using a BYK Gardner Haze-gard Plus. The surface resistivity was measured using a Fluke 175 True RMS Multimeter or contactless resistance meter, Delcom model 717B conductance monitor. A more typical device is a 4 point probe system for measuring resistance (e.g., by Keithley Instruments).

The interconnectivity of the nanowires and an areal coverage of the substrate can also be observed under an optical or scanning electron microscope.

Example 4

Evaluation of Resistivity of Composite Transparent Conductor

An ITO film was first sputtered on a glass substrate. The ITO film was about 250Ω/□. A silver nanowire film was coated on the ITO film. The silver nanowire film was based on an ink composition that produced conductive films of about 300-500Ω/□ in sheet resistance.

If the composite transparent conductor was treated merely as a pair of parallel resistors, the sheet resistance would have had an expected value of about 135-170Ω/□. However, the resulting composite film showed sheet resistance in the range of 50-80Ω/□, which was about 100% more conductive than the expected value. Accordingly, the combined conductive media exhibited superior conductivity than the mere additive effects of the individual conductive medium.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A composite transparent conductor comprising:
a first layer of a primary conductive medium comprising a first type of electrically conductive nanostructures, wherein:
a plurality of the first type of electrically conductive nanostructures are below an electrical percolation threshold, and
the primary conductive medium has a first mesh size; and
a second layer of a secondary conductive medium contacting the first layer of the primary conductive medium, wherein:
the secondary conductive medium is vertically conductive so as to equalize an electrical potential distribution in the composite transparent conductor, and
the secondary conductive medium has a second mesh size at least five times smaller than the first mesh size.

2. The composite transparent conductor of claim 1, wherein:
the secondary conductive medium comprises a plurality of a second type of electrically conductive nanostructures,
the first type of electrically conductive nanostructures has a first material composition, and
the second type of electrically conductive nanostructures has a second material composition different than the first type of electrically conductive nanostructures.

3. The composite transparent conductor of claim 1, wherein:
the secondary conductive medium comprises a plurality of a second type of electrically conductive nanostructures,
the first type of electrically conductive nanostructures has a first aspect ratio,
the second type of electrically conductive nanostructures has a second aspect ratio, and
the first aspect ratio is less than the second aspect ratio.

4. The composite transparent conductor of claim 3, wherein one of the plurality of the second type of electrically conductive nanostructures connects at least two of the plurality of the first type of electrically conductive nanostructures.

5. The composite transparent conductor of claim 3, wherein one of the plurality of the second type of electrically conductive nanostructures connects with at least another one of the plurality of the second type of electrically conductive nanostructures.

6. The composite transparent conductor of claim 3, wherein the plurality of the second type of electrically conductive nanostructures comprises a plurality of anisotropic nanostructures.

7. The composite transparent conductor of claim 1, wherein:
the secondary conductive medium comprises a plurality of a second type of electrically conductive nanostructures,
the first type of electrically conductive nanostructures has a first geometry,
the second type of electrically conductive nanostructures has a second geometry different than the first geometry.

8. The composite transparent conductor of claim 1, further comprising a substrate layer, wherein:
the first layer of the primary conductive medium is positioned on top of the second layer of the secondary conductive medium, and
the second layer of the secondary conductive medium is positioned on top of the substrate layer.

9. The composite transparent conductor of claim 1, wherein the primary conductive medium and the secondary conductive medium are integrated.

10. The composite transparent conductor of claim 1, wherein the primary conductive medium and the secondary conductive medium are electrically coupled.

11. The composite transparent conductor of claim 1, wherein:
the secondary conductive medium comprises a plurality of a second type of electrically conductive nanostructures, and
the plurality of the second type of electrically conductive nanostructures form a conductive network.

12. The composite transparent conductor of claim 11, further comprising a third type of electrically conductive nanostructures.

13. The composite transparent conductor of claim 12, wherein the third type of electrically conductive nanostructures are metal nanoparticles, metal oxide nanoparticles, metal nanowires, carbon black or a combination thereof.

14. A composite transparent conductor comprising:
a first layer of a primary conductive medium comprising a first type of electrically conductive nanostructures, wherein a plurality of the first type of electrically conductive nanostructures are below an electrical percolation threshold; and
a second layer of a secondary conductive medium contacting the first layer of the primary conductive medium, wherein:
the secondary conductive medium comprises a second type of electrically conductive nanostructures,
the secondary conductive medium is vertically conductive so as to equalize an electrical potential distribution in the composite transparent conductor, and a specific weight of the second type of electrically conductive nanostructures is less than a specific weight of the first type of electrically conductive nanostructures.

15. The composite transparent conductor of claim 14, wherein:
the first type of electrically conductive nanostructures has a first material composition, and
the second type of electrically conductive nanostructures has a second material composition different than the first type of electrically conductive nanostructures.

16. The composite transparent conductor of claim 14, wherein:
the primary conductive medium has a first mesh size, and
the secondary conductive medium has a second mesh size at least five times smaller than the first mesh size.

* * * * *